US010072326B2

(12) United States Patent
Siebert et al.

(10) Patent No.: US 10,072,326 B2
(45) Date of Patent: Sep. 11, 2018

(54) VERSATILE HOLDER FOR TREATING THE SURFACE OF ROD-SHAPED SUBSTRATES

(71) Applicant: OERLIKON SURFACE SOLUTIONS AG, TRÜBBACH, Trübbach (CH)

(72) Inventors: Max Siebert, Kirchheimbolanden (DE); Remo Vogel, Buchs SG (DE); Karl Wolfgang Jotz, Schopfloch (DE)

(73) Assignee: OERLIKON SURFACE SOLUTIONS AG, PFAFFIKON, Pfaffikon (CH)

( * ) Notice: Subject to any disclaimer, the term of this patent is extended or adjusted under 35 U.S.C. 154(b) by 313 days.

(21) Appl. No.: 14/888,277

(22) PCT Filed: Apr. 24, 2014

(86) PCT No.: PCT/EP2014/001091
§ 371 (c)(1),
(2) Date: Oct. 30, 2015

(87) PCT Pub. No.: WO2014/177254
PCT Pub. Date: Nov. 6, 2014

(65) Prior Publication Data
US 2016/0076131 A1  Mar. 17, 2016

(30) Foreign Application Priority Data

May 2, 2013 (DE) .................. 10 2013 007 454

(51) Int. Cl.
*B23P 19/10* (2006.01)
*C23C 14/02* (2006.01)
(Continued)

(52) U.S. Cl.
CPC .......... *C23C 14/021* (2013.01); *C23C 14/042* (2013.01); *C23C 14/50* (2013.01); *H01J 37/32403* (2013.01); *H01J 37/32715* (2013.01)

(58) Field of Classification Search
CPC .............. B23Q 1/03; B23Q 1/25; B23Q 1/01
See application file for complete search history.

(56) References Cited

U.S. PATENT DOCUMENTS 4,528,208 A 7/1985 Hirvonen
4,711,353 A * 12/1987 Rozmestor ............. B25H 3/021
206/303

(Continued)

FOREIGN PATENT DOCUMENTS

DE 10 2005 003047 A1 7/2006
DE 2008 260973 A 10/2008
DE 10 2011 050451 A1 11/2012

OTHER PUBLICATIONS

International Search Report for PCT/EP2014/001091 filed Apr. 24, 2014.

*Primary Examiner* — Lee D Wilson
(74) *Attorney, Agent, or Firm* — Notaro, Michalos & Zaccaria P.C.

(57) ABSTRACT

A holder for securing at least one rod-shaped substrate body having a variable cross-section along the substrate body has a substrate body region BQ1 comprising a surface to be treated. The holder comprises at least one perforated wall as the front wall, the wall having at least one opening, and also comprises a support element and a retaining element. The support element is constructed and/or secured in the opening in such a way that at least part of the substrate body can be arranged longitudinally and obliquely in the support element and the retaining element is constructed and/or secured in the opening in such a way that the retaining element can retain the substrate body at a point between the region BQ1 and the remainder of the substrate body such that the region BQ1 protrudes from the holder through the opening.

13 Claims, 9 Drawing Sheets

(51) Int. Cl.
*C23C 14/04* (2006.01)
*C23C 14/50* (2006.01)
*H01J 37/32* (2006.01)

(56) References Cited

U.S. PATENT DOCUMENTS

| | | | | |
|---|---|---|---|---|
| 5,031,974 | A * | 7/1991 | Feucht | A47B 47/025 |
| | | | | 312/108 |
| 5,560,480 | A * | 10/1996 | Singleton | B25H 3/06 |
| | | | | 206/373 |
| 5,775,513 | A * | 7/1998 | Anthony | A63B 55/00 |
| | | | | 206/315.3 |
| 5,996,818 | A * | 12/1999 | Boje | B01L 9/06 |
| | | | | 206/443 |
| 6,474,481 | B1 * | 11/2002 | Liu | B25H 3/003 |
| | | | | 206/377 |
| 6,719,141 | B2 * | 4/2004 | Heinz | A61M 5/008 |
| | | | | 206/443 |
| D598,566 | S * | 8/2009 | Allaer | D24/230 |
| D608,013 | S * | 1/2010 | Coulling | D24/224 |
| 2007/0104871 | A1 | 5/2007 | Stout | |
| 2010/0193410 | A1* | 8/2010 | Boll | B07B 1/02 |
| | | | | 209/418 |
| 2016/0076131 | A1* | 3/2016 | Siebert | C23C 14/042 |
| | | | | 427/299 |

\* cited by examiner

VERSATILE HOLDER FOR TREATING THE SURFACE OF ROD-SHAPED SUBSTRATES

The present invention relates to a holder for the surface treatment of rod-like substrates. A holder according to the present invention is particularly well suited for the surface treatment of cutting tools of the variety bar blade.

STATE OF THE ART

Surfaces of many objects are nowadays treated in order to achieve certain properties at the surface.

Surfaces of components and tools are nowadays often significantly improved by coatings for particular applications.

The choice of the right substrate holder plays a very important role in any surface treatment process. Therefore expedient substrate holders for specific surface treatment processes are being developed that take into account the nature of the substrate surface to be treated, as well as other substrate properties (such as, for example substrate shape, -dimension and -composition).

A nowadays usual surface treatment of substrates is the coating. Thereby layers are coated with special properties to certain substrate surfaces. By coating improved properties are imparted to the substrate surfaces, which enable the use of these substrates in certain applications or a power increase of these substrates in a particular application.

For example, the cutting surfaces of cutting tools are normally (at least partially) coated with wear protection coatings to increase the cutting performance of these tools.

Therefore specific substrate holders are developed.

For example, the patent document DE60002579T2 discloses a hollow substrate holder, which is used for carrying a drill set for depositing a ceramic coating on portions of the drills, which extend from the tips thereof. This substrate holder comprises:
- at least one perforated outer wall provided with an array of openings into which the drills are inserted so that the aforementioned parts protrude from the holder
- a support wall within the hollow interior of the holder for the or each perforated outer wall parallel to the outer wall and spaced by the latter and provided with a corresponding array of openings, in order to arrange the inserted drills substantially in parallel with their shafts,
- a stop means within the hollow interior of the holder which is spaced from the or each support wall inwardly so as to position the tips of drills of the same diameter, which essentially protrude the same extent from the outer wall, the hollow interior of the holder and the positioning of the drills are such that the part of each drill within the outer wall is shielded from the external environment, but is exposed to the atmosphere in the interior of the holder.

However, the above-mentioned support has the disadvantage that it lacks versatility, and therefore cannot be applied for the coating of different kinds of rod-like substrates at the same time, but only for the coating of substrates (in this case drills) having substantially the same length and same diameter.

OBJECT OF THE PRESENT INVENTION

It is an object of the present invention to provide a versatile holder for the surface treatment of rod-like substrates with at least two areas with different cross section, whereby one of these areas includes an end having a cross section smaller than the cross section of the at least another area. The holding must allow that at least the end of smaller cross section can be coated in the same way independently of the entire substrate length.

The holder according to the present invention should also allow the rod-shaped substrates fastened in the holder to be subjected to a plurality of surface treatment processes, without the need of the substrates to be discharged from the holder and then reloaded into the same or into a different holder. Thereby, the amount of handling and risk of damage to the substrates are reduced.

In particular, to enable a holder according to the present invention should enable cleaning, pre-treatment, coating and post-treatment of blades according to the application requirements.

DESCRIPTION OF THE INVENTION

FIGS. 1 to 9 are intended as a contribution to better understanding but not to limit the present invention:

FIG. 6: a) front cover mask 17 with an array of apertures 5''' and a retaining element 11 at each opening 5''', and b) holder with a front cover mask 17. In the holder of FIG. 6b, the front cover mask 17 is attached to the front wall 3 by connecting elements 8, for example screws, so that the substrate body 10 using the retaining elements 11 of the front cover mask 17 are stopped in a manner that that the area of the substrate body with its surface to be treated protrudes from the holder through the openings 5' or 5'''. The distance between the front cover mask 17 and the front wall 3 is selected so that no beam particles can remain trapped between the front wall 3 and the front cover mask 17, if for example, the surface to be treated is subjected of a granulate-beaming surface treatment.

FIG. 8: Holder arrangement with two holders, each holder according to an embodiment of the present invention, one arranged on top of the other, a) with a coating protective cover 40, for example for carrying out a coating process, and b) without coating protective cover 40, for example for carrying out a cleaning or granulate-beaming process.

The object of the present invention is achieved by providing a holder with an open design, as described in claim 1.

Figure 1:
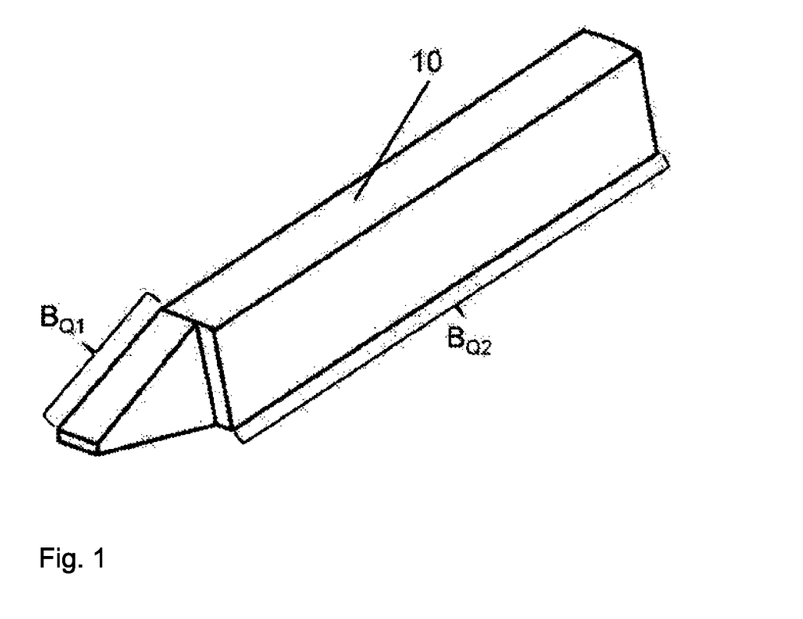
FIG. 1: Substrate body 10 having a surface to be treated in the substrate body area $B_{Q1}$ and a not to be treated surface in the substrate body area $B_{Q2}$.

The present invention relates to a holder (such as the holder shown for example in FIG. 2) for the attachment of rod-shaped substrates 10 (such as the substrate shown for example in FIG. 1) with at least two areas, $B_{Q1}$ and $B_{Q2}$, with different cross sections Q1 and Q2, wherein one of the areas includes an end having a cross section smaller than the cross section of the at least other area, for example Q1<Q2, wherein the holder comprises at least one perforated wall, which is provided with an array of openings and is used as the front wall 3, into which the rod-shaped substrates can be inserted, wherein:
  at each opening 5 of the front wall 3 a support element 9 (i.e. a U-profile or a rectangular profile) is arranged positioned from the opening level upwards obliquely, preferably with an inclination angle to the horizontal α (as in FIG. 3) greater than 2°, where the substrate can be arranged at least partially, and
  at least one guide element 11 is provided at each opening 5 of the front wall 3, to stop the substrate at the at least one location between the area with the smaller cross-section $B_{Q1}$ and the at least other area $B_{Q2}$.

The substrate is thereby inserted into the holder in such a way that the end of the substrate in the range of smaller cross section $B_{Q1}$ lies under the other end of the substrate. Thanks to this holder structure the substrates can be inserted through the supporting elements into the holder towards the front wall, so that the substrates are pressed by the force of gravity towards the retaining elements and be stopped by the retaining elements in such a way, that at least the end of the substrate in the region of smaller cross section $B_{Q1}$ will protrude through the opening 5 of the front wall 3 from the holder.

Figure 2:
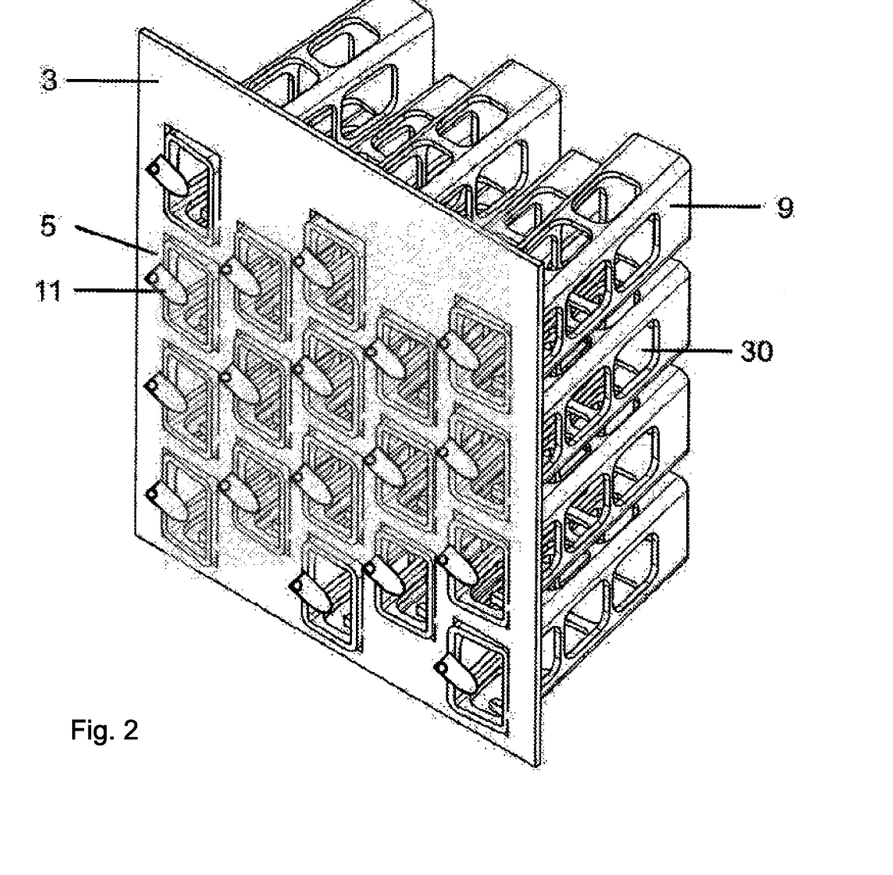
FIG. 2: Holder according to an embodiment of the present invention having an array of support elements 9 to accept rod-shaped substrate bodies, which support elements 9 are attached to a front wall 3 with an array of openings (5), so that one support element 9 is attached at each opening 5, and wherein at each opening 5 a retaining element 11 is present for stopping the substrate body. The support elements shown in FIG. 2 are, for example, rectangular profiles with recesses 30, which should facilitate cleaning of the substrate body 10 (not shown in the FIG. 2) during a cleaning process.
Figure 3:
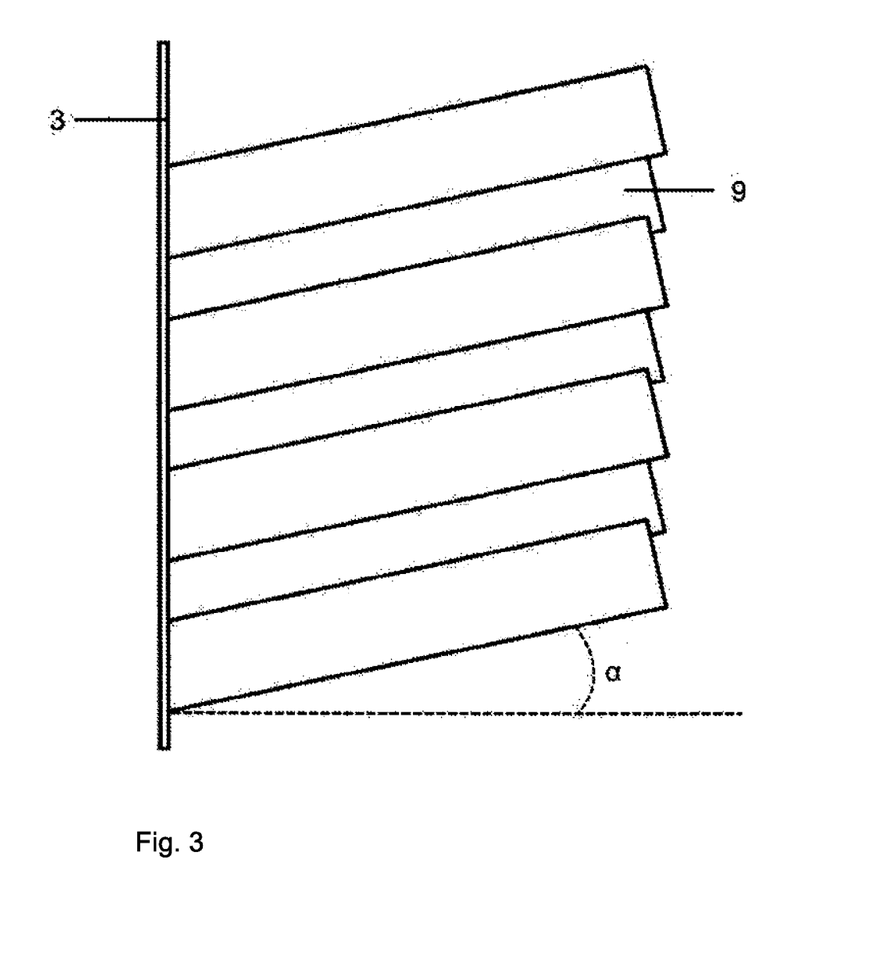
FIG. 3: Arrangement of support elements 9, wherein the support elements 9 are arranged with an inclination angle α to the horizontal and arranged parallel in the vertical plane.

According to one embodiment of the present invention, the supporting members 9 have two ends and at least one support element is disposed so that one end of the supporting member is strut onto an opening 5 of the front wall 3 (as shown in FIG. 2). Preferably, the support elements 9 are welded to the openings.

Figure 4:
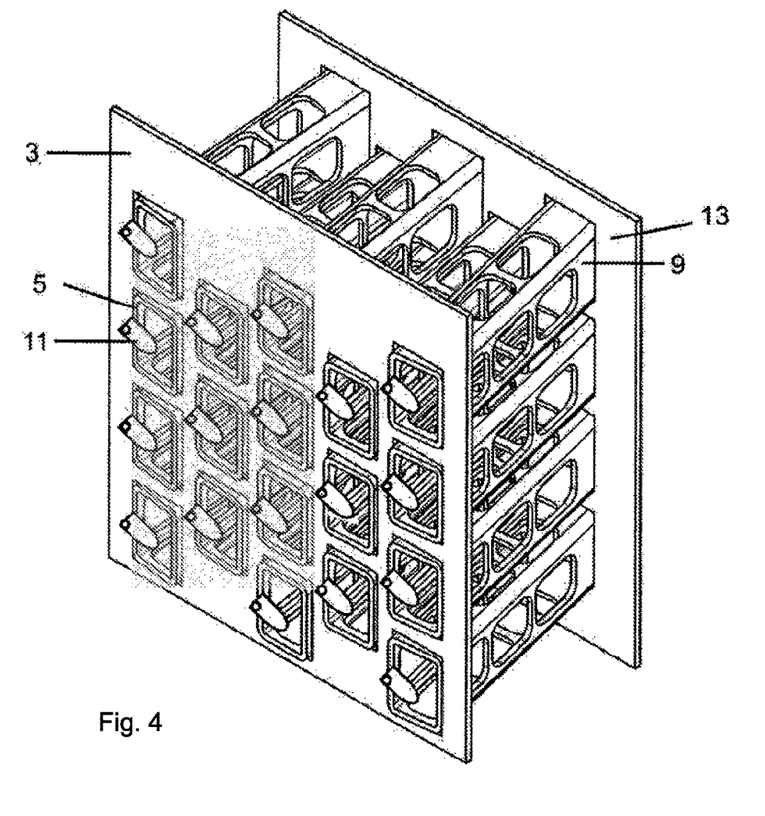
FIG. 4: Holder according to an embodiment of the present invention with an additional perforated wall as a supporting wall 13.

A further preferred variant of the holder according to the present invention comprises at least a second perforated wall, which serves as a supporting wall 13 for the supporting elements 9. This supporting wall 13 is also provided with an array of openings 5', through which the substrates can be inserted into the holder. The arrangement of openings 5' in the support wall 13 is preferably the same as the arrangement of openings 5 in the front wall 3. In this way, for example, the remote end from the front wall 3 of the supporting member 9 can be strut onto an opening 5' of the support wall 13 (as shown in FIG. 4). Preferably the support wall 13 is disposed substantially in parallel from the front wall 3 and the arrangement of the openings 5' of the support wall 13 is at least slightly above that of the front wall 3, so that the supporting elements 9 may rest as already mentioned above in an inclination angle α to the horizontal, while keeping the end of a support element 9 arranged at the front end wall 3 located below the portion of the support wall 13 of the support element 9. Preferably, the areas of the support elements 9 arranged at the openings 5' of the support wall 13 are welded onto the openings 5'.

Figure 6:
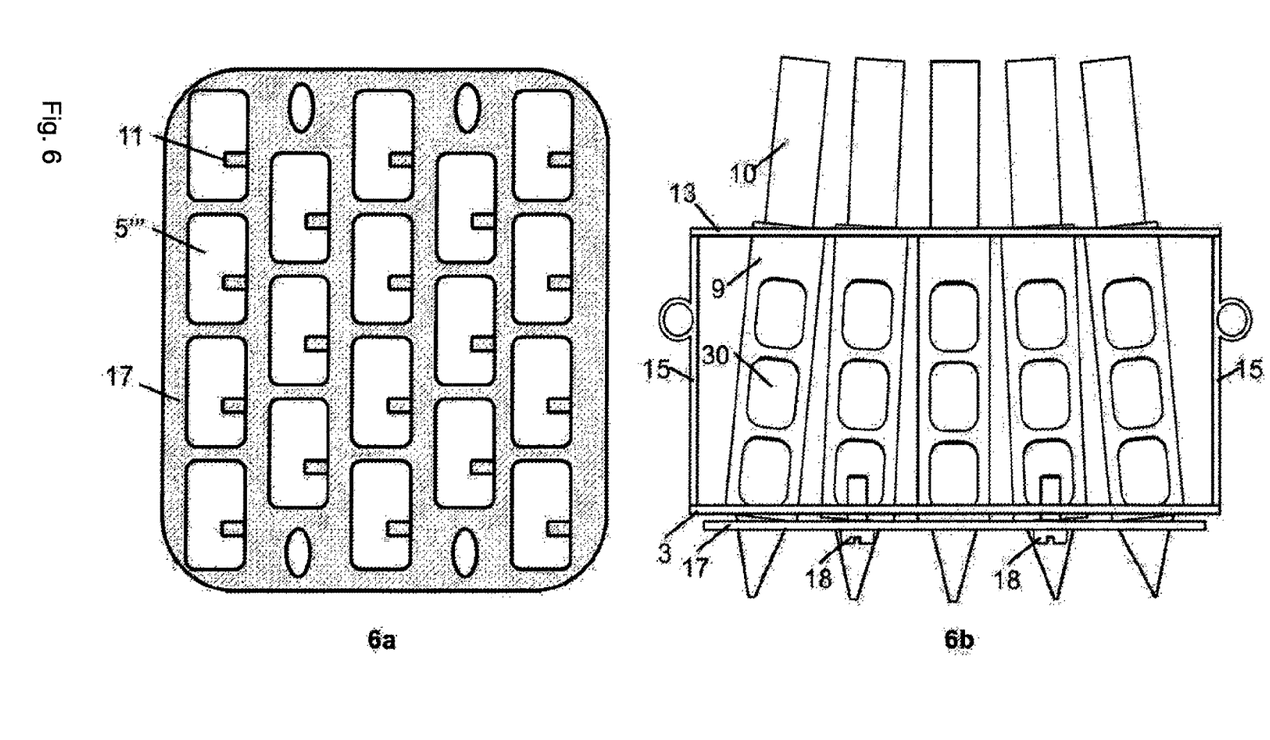

In a further preferred variant of a holder according to the present invention, the retaining elements 11 are made as part of a front cover mask 17 with an array of openings 5''' (as shown for example in FIG. 6a) so that the front cover mask may be secured for example by means of connecting elements 18 onto the front wall. The connecting elements 18 can be, for example, screws which can serve as detachable connections (as shown in FIG. 6b).

Because of the open design of the holders according to the present invention, they enable the cleaning of the substrates held in the holders in cleaning baths.

Figure 5:
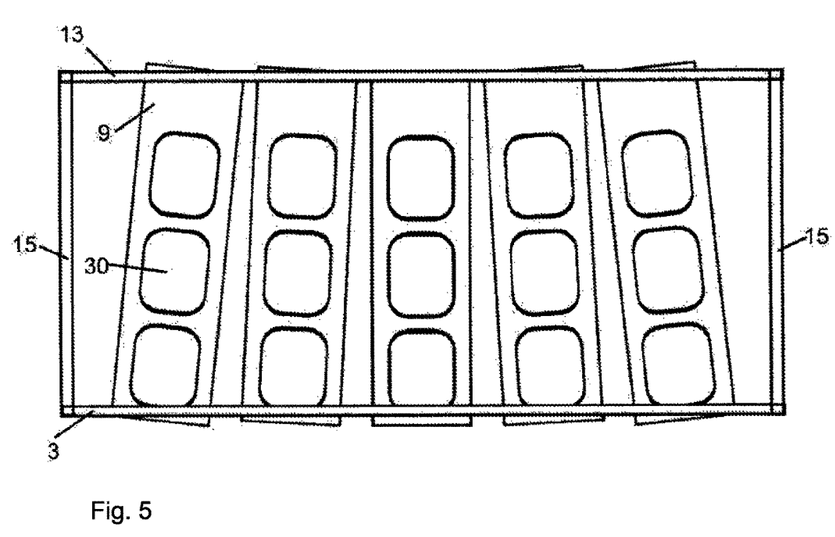
FIG. 5: Holder according to an embodiment of the present invention with connecting elements 15 for fixing the position of the front wall 3 in relation to the support wall 13. At the same time, an arrangement of support elements 9 is shown in FIG. 5, in which the supporting elements 9 are arranged incisive in the horizontal plane and thus the distance between the support elements in the horizontal plane with respect to the areas closer to the support elements 9 that are closer to the front cover 3, is greater with regard to the areas of the supporting members 9 arranged distant from front cover 3.

Preferably, the position of the front wall 3 in relation to the position of the support wall 13 in the holder is fixed by composite elements 15 (as shown in FIG. 5).

In addition, such a holder with an open design according to the present invention may also be used for the mechanical surface treatment of the parts of the substrates which protrude from the holder through the openings 5, 5''' of the front wall 3 and the front cover mask 17 (at least the end or the peak in the area $B_{Q1}$). In the sense of mechanical surface treatment within the scope of the present invention is in particular meant the procedure of granulate-beaming processes.

Figure 7:
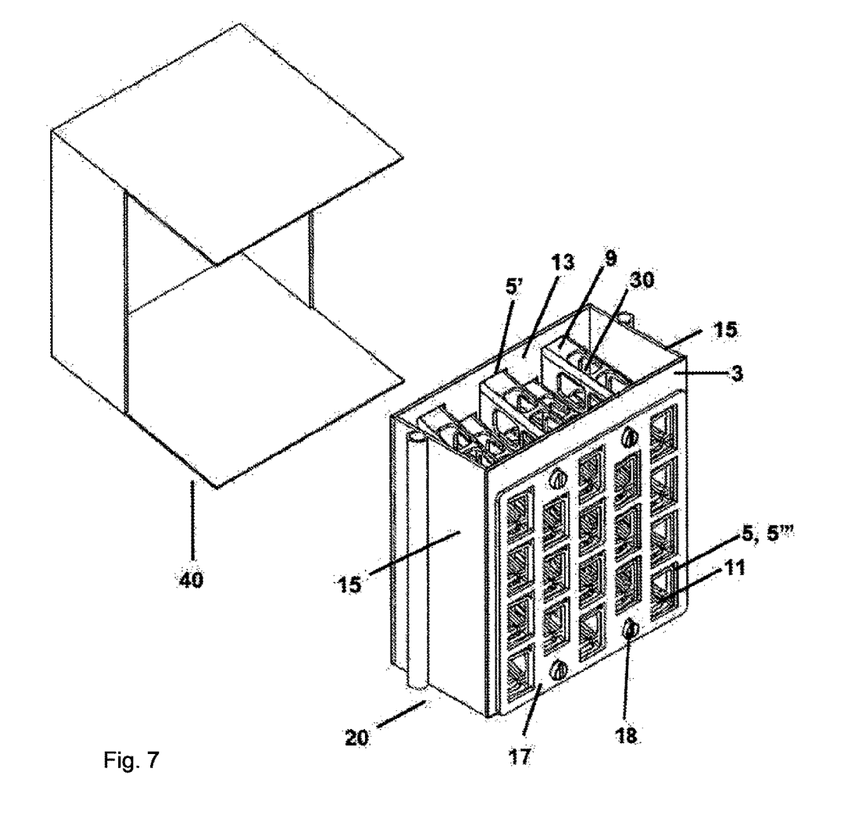
FIG. 7: Holder according to an embodiment of the present invention with connecting elements 15 in the form of walls, such that the holder is constructed in the form of a compartment cartridge 20. In addition, a cover 40 is shown, which is intended for example in a coating process to prevent not to be treated areas of the substrate body from being coated. Therefore, such a cover 40 is referred to in the present invention in particular as a coating protective cover 40.

In a preferred variant of a holder according to the present invention, particularly well suited for cleaning, coating and other surface treatments, such as granulate-beaming (e.g. as a pre- and/or post-treatment of the surface to be coated) of cutting tools of the variety blades, the composite elements 15 may be walls (as shown in FIG. 7) so that it is prevented that parts of the body of the substrates are undesirable coated of its sides. This variant, in the context of the present invention, is called compartment cartridge 20.

In order to ensure that only the desired surfaces of the substrates or in the examples of blades the tip portion of the substrates (at least the end of the area $B_{Q1}$) can be efficiently coated by physical vapor deposition, the holder is equipped according to the present invention with a coating protective cover 40 which shades the regions of the substrate that does not protrude through an opening 5 of the front wall 3. Thereby an unwanted coating of parts of the body not to be coated of the substrate (which may be otherwise be coated from above, below and/or behind) is prevented.

In the compartment cartridge 20, the blades 10 (not shown in FIG. 7) can be set in a matrix arrangement, as shown in FIG. 7, as set of blades (i.e. 1 set of 16-22 blades). By a symmetrical structure of the holder, the front cover mask 17 can be mounted in four positions and can be moved vertically, so that at each mounting position of the front cover mask 17 the blades can be kept at a different location. This allows a front cover mask 20 to be used more varied and thus the same front cover mask 17, mounted just in a different position, can be used for the surface treatment of blades with other dimensions and/or geometry.

The above-mentioned inclination angle α of the profiles in relation to the horizontal shall be selected large enough so that the blades do not move through any vibration of the holder back towards the rear portion of the holder. However, the angle should not be selected that large that the surfaces to be coated of the substrates can be shaded such that the coating of these surfaces is impaired. For example, in various versions of a holder according to the present invention, an angle between 5° to 20° from the horizontal (as outlined in FIG. 3) has proved to be particularly well suited.

The rectangular sections 9 were "maximum" provided with openings 30, as shown for example in FIG. 6b, to achieve an optimum cleaning result.

By the expression "Maximum provided with openings 30" it is meant that the openings 30" are spread in case of the illustrated rectangular profiles 9' such that the largest area of the blades that are held in the rectangular profiles is exposed. At least the profiles must be provided with openings so that at least more than 50% of the area of the blades can have direct contact with the detergent during a cleaning process. Preferably, the profiles will be provided with opening so that the profiles do not lose mechanical stability so as to be deformed by the normal use of the holder.

Another way to build "quasi rectangular profiles", which are provided with a maximum of openings, would be the use of profiles which have a U-shape in cross-section instead of a rectangular shape. In this case, the U-profiles according to the present invention would be positioned such in the holder, that the upper surface of bar blades located in the holder is completely free.

In addition, the distance between the front cover mask 17 and the compartment cartridge 20 has been provided in order to prevent a fixing of particles from a blasting medium between the front cover mask 17 and the rest of the compartment cartridge 20. Preferably, this distance is greater or equal to 0.5 mm. For example, very good results in different beam processes were achieved with a distance of 0.8 mm. But it also has to be considered that this distance must not be so large that undesired surfaces of the substrates could be coated too.

Thus, the use of a holder according to the present invention is possible as well for performing beam processes such as microjets, for treating the surface both before and after the coating. This results in a consistent quality of the complete coating services, but without the increased handling expenses caused by using several holders (sorting of the substrates to be treated, charging into a first holder, discharging, transportation, re-sorting, recharging into a second holder, etc.). This also reduces the risk of damaging the blades during processing.

As well the construction of the compartment cartridge 20 is designed so that the blades 10 are arranged conically in a spherical arrangement. Thus the blades 10 are arranged further spaced, resulting in a more uniform distribution of the coating layer on the surface to be coated by all blades (both external and internal placed blades) (see FIG. 6b). With this spherical arrangement of the rectangular profiles, in which the distance between the blades 10 in the rear area $B_{Q2}$ is reduced, the distance between the to be coated blade tips $B_{Q1}$ can be increased, which has a positive influence on the film thickness distribution.

For the use of a holder according to the present invention in a vacuum coating process, in which at least one target is used as the solid material source for the production of the coating, whereby for example blades with a rectangular or similar cross section are coated, having at least one to be coated surface, the blades 10 should preferably be arranged in the profiles 9 so that the surface rotates toward the target in order to allow a higher deposition on the surface and that not to be coated surfaces of the blades $B_{Q2}$ shall be covered with a protective coating 40 (as shown in FIG. 7).

Preferably the material that is used for the construction of a holder according to the present invention is selected which does not affect the use of the holder for all process steps, for example steel 1.4301. This material has a sufficient mechanical strength, is suitable for vacuum, non-magnetic, and resistant against the conditions employed during cleaning processes (chemicals and temperatures).

Figure 8:
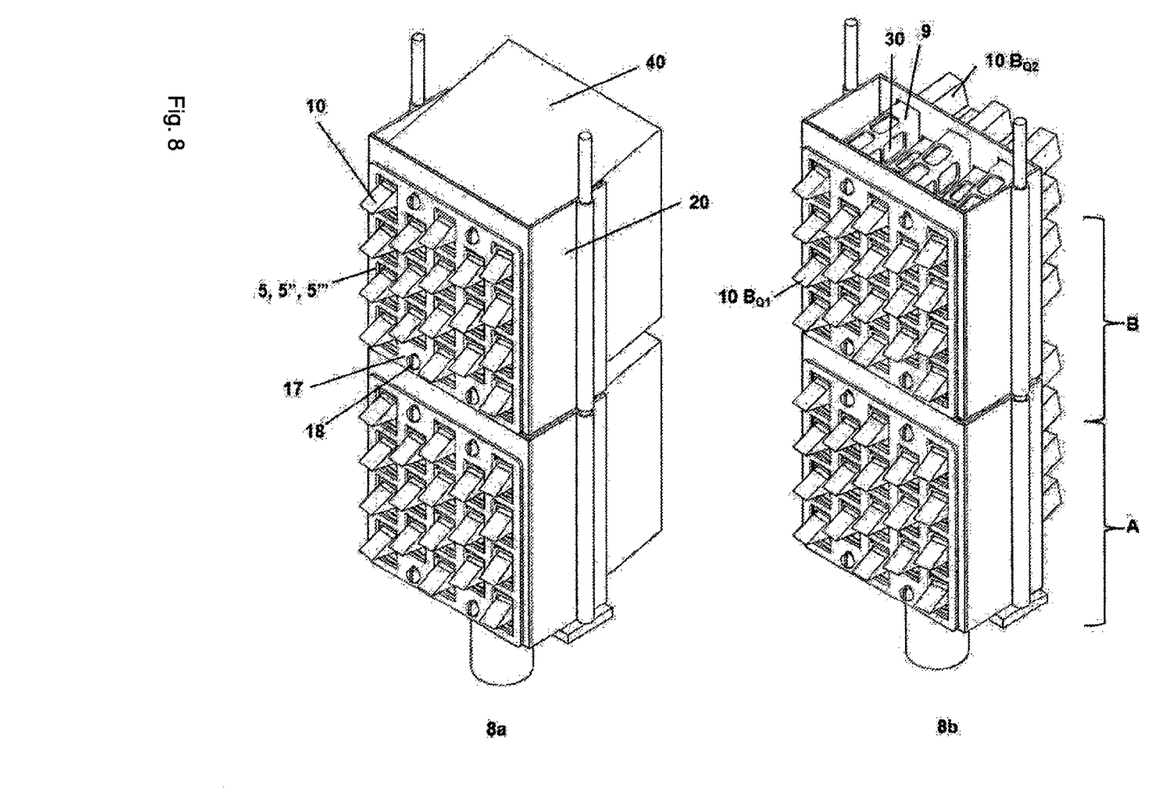

Treatment processes such as cleaning and the microjet may for example, as shown in FIG. 8b, be carried out in at least a twin-pack (A+B). This reduces the cost of handling also.

To prevent the coating of undesired surface areas of the blades, i.e. $B_{Q2}$, the compartment cartridge 20 is covered with the protective coating 40, as shown in FIG. 8b. Also trees with at least a twin-pack (A+B) can be constructed as well for the coating, as shown in FIG. 8b.

According to the invention the same holder can be used for the implementation of all process steps (e.g. cleaning, microjet or granulate-beaming and coating; possibly stripping, if it is for example a chemical or electrochemical stripping process), without losing any quality of the treatment of the surface.

Figure 9:
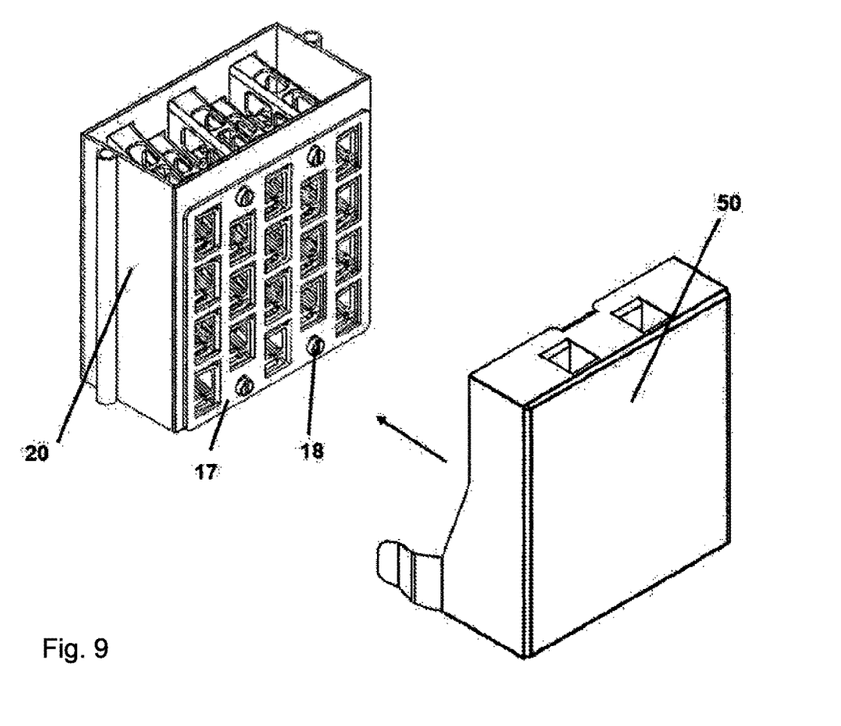
FIG. 9: Holder according to one embodiment of the present invention with a transport protection cover (50).

During transportation of the substrates from one process step to another in a holder according to the present invention, however, it could happen that the portions of the substrates, which protrude from the support may be damaged. Therefore, these substrate regions will preferably be covered during transport. For example a transport protection cover 50 may therefore be used, as shown in FIG. 9.

The invention claimed is:

1. Holder for fastening at least one rod-shaped body (10) with variable section along the substrate body and a surface to be treated, which is located in an area $B_{Q1}$ of the substrate body (10) comprising an end of the substrate body (10) and a smaller cross-section than the rest of
   the substrate body (10), wherein the holder comprises at least one perforated wall as a front wall (3), which is provided with at least one opening (5) wherein the holder comprises at least one support element (9) and a retaining element (11), which are arranged at an opening (5), wherein:
   the support element (9) is constructed or secured in such a way to the opening (5), that the substrate body may be at least partially disposed oblique at an inclination angle α to the horizontal alongside in the support element (9), and
   the retaining element (11) is constructed or secured in such a way to the opening (5) that the retaining element (11) can stop the substrate body at a position between the area $B_{Q1}$ and the remainder of the substrate body in such a way that the area $B_{Q1}$ projects through the opening (5) from the holder, wherein the angle of inclination α to the horizontal is greater than 2°.

2. Holder according to claim 1, characterized in that, preferably 5°≤α≤20°.

3. Holder according claim 1, characterized in that the supporting member (9) is elongate and has two ends, one end of the support element (9) being close to the front wall (3) or on the front wall (3) and the other end distant from the front wall (3).

4. Holder according to claim 3, characterized in that the holder comprises at least two support elements (9) for attachment of at least two substrate members (10) which are arranged parallel in the vertical plane or incisive in the horizontal plane, wherein the distance in the horizontal plane between the support elements (9) is greater with respect to the close to the front wall (3) lying areas compared to the distant from the front wall (3) areas, thereby also the distance in the horizontal plane between the substrate members (10) is greater with respect to the close to the front wall (3) lying areas compared to the distant from the front wall (3) areas.

5. Holder according to claim 4, characterized in that the holder comprises at least a second perforated wall, distant by a spacing from the front wall (3), is provided with at least one opening (5')
and being arranged as a supporting wall (13) for the supporting members (9) in the holder such that at least a part of one of the support elements (9) is supported by an opening (5').

6. Holder according to claim 5, characterized in that the second perforated wall is provided with an array of openings (5"), the number of openings (5') in the array of openings (5") of the supporting wall (13) corresponds to the number of openings in the array of openings (5) of the front wall (3), and the support wall
(13) is arranged in the holder in such a way that each supporting member (9) at the same time is supported by an opening (5) and an opening (5').

7. Holder according to claim 6, characterized in that the supporting wall (13) in the holder is arranged parallel with respect to the front wall (3),
or the array of openings (5"), or to the front wall (3) and the array of openings (5") and is designed such that
in the vertical plane, each opening of the arrangement of openings (5') is arranged above the opening of the corresponding array of openings (5), or in the horizontal plane, the distance between the openings of the array of openings (5') in the support wall
(13) is smaller than the distance between the openings of the array of openings (5) in the front wall (3).

8. Holder according to claim 1, characterized in that the retaining elements (11) are made in the form of a front cover mask (17) having an array of openings (5''').

9. Holder according to claim 5, characterized in that the holder comprises composite elements (15), with the aid of which the position of the front wall (3) in relation to the position of the support wall (13) is secured.

10. Holder according to claim 9, characterized in that the composite elements (15) are walls which form together with the rest of the holder a compartment cartridge (20).

11. Holder according to claim 1, characterized in that the holder is loaded with at least one substrate body (10) in such a way that the area $B_{Q1}$ of the substrate body (10) is projecting through one of the openings (5) of the front wall (3) of the holder and thereby as well the surface to be treated of the substrate.

12. Holder according to claim 11, characterized in that the holder comprises a cover as a coating protective cover (40) which shade the spaces of the substrate body (10) which do not protrude through the opening (5) of the front wall
(3) wherein the cover (40) is formed as an open box or a hood which is adapted to be pushed over from the side of the support wall (13).

13. Holder according to claim 11, characterized in that the holder comprises a cover as a transport protection cover (50), which covers the areas of the substrate body (10) protruding through the opening (5) of the front wall (3), wherein
the protection cover (50) is formed as an open box or a hood which is adapted to be pushed over from the side of the cover mask (17).

* * * * *